United States Patent [19]

Ishii et al.

[11] 4,431,972

[45] Feb. 14, 1984

[54] PUSH-PULL AMPLIFIER

[75] Inventors: Satoshi Ishii; Hiroshi Koinuma, both of Tokyo, Japan

[73] Assignee: Pioneer Electronic Corporation, Tokyo, Japan

[21] Appl. No.: 301,863

[22] Filed: Sep. 14, 1981

[30] Foreign Application Priority Data

Sep. 17, 1980 [JP] Japan .................................. 55-128753

[51] Int. Cl.³ .............................................. H03F 3/26
[52] U.S. Cl. .................................... 330/267; 330/273; 330/297
[58] Field of Search ............... 330/263, 267, 268, 273, 330/274, 296, 297

[56] References Cited

U.S. PATENT DOCUMENTS 3,914,703  10/1975  Stauffer ............................... 330/268
4,160,216  7/1979  Thornton ............................ 330/267
4,342,966  8/1982  Tamura ............................... 330/268

Primary Examiner—James B. Mullins
Assistant Examiner—Gene Wan
Attorney, Agent, or Firm—Sughrue, Mion, Zinn, MacPeak & Seas

[57] ABSTRACT

A current path is provided in a class B push-pull amplifier for maintaining a low level bias current to each output transistor even during its normally off state.

6 Claims, 9 Drawing Figures 4,431,972

PUSH-PULL AMPLIFIER

BACKGROUND OF THE INVENTION

This invention relates to amplifiers and more particularly to SEPP (single-ended push-pull) type class "B" amplifiers.

A class "B" SEPP amplifier is one type of audio power amplifier, and has, by way of example, a class "B" amplifier circuit arrangement in which a pair of grounded-emitter (or grounded source) type transistors are employed, with the collectors (or the drains) connected together to provide an output. Such a circuit includes a pair of bias circuits having diodes, etc. to apply biases to the control electrodes of one pair of output amplification elements, and a pair of drive elements to alternately supply current corresponding to an input signal to each bias circuit every half period of the input signal, the drive elements being driven by the output of a voltage amplification stage. Since the circuit operation is of the class "B" amplification type, the output amplification elements are cut off every half period of the input signal and this results in a so-called "switching distortion".

Accordingly, an object of this invention is to provide a simple class "B" push-pull amplifier arrangement which can prevent the occurrence of the switching distortion.

SUMMARY OF THE INVENTION

Briefly, this is achieved by a class "B" push-pull amplifier according to this invention wherein when current supply to a bias circuit for each of the output active elements is suspended during the "off" period of its drive element at the front stage, a predetermined small current is nevertheless supplied to the "off" bias circuit through a further current path so that the output amplification elements are always provided with at least a small bias current and will operate in the active region at all times.

BRIEF DESCRIPTION OF THE DRAWINGS

This invention will be described with reference to the accompanying drawings, in which.

DESCRIPTION OF THE PREFERRED EMBODIMENTS

Figure 1:
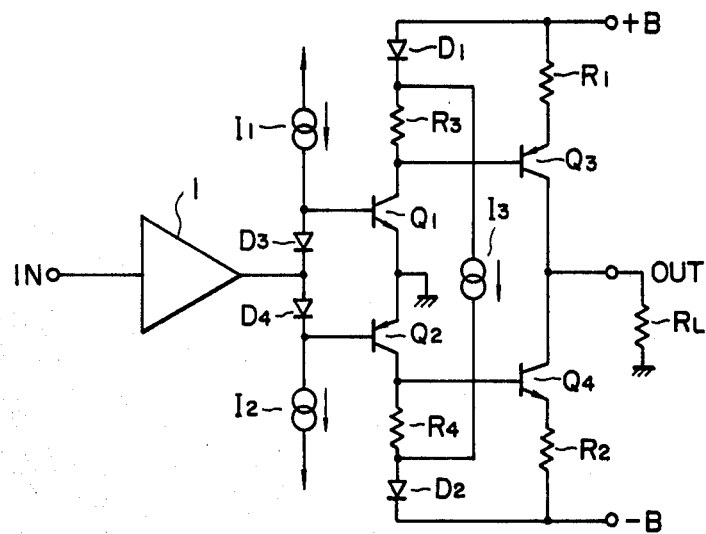
FIGS. 1 and 2 are circuit diagrams showing first and second examples of a push-pull amplifier according to this invention.

FIG. 1 is a circuit diagram showing a first example of a push-pull amplifier according to this invention. A PNP transistor $Q_3$ and NPN transistor $Q_4$ are grounded-emitter type output transistors having the emitters connected respectively through resistors $R_1$ and $R_2$ to power sources $+B$ and $-B$, and their collectors are connected together to drive a load $R_L$. A bias circuit consisting of a diode $D_1$ and a resistor $R_3$ is provided for establishing a bias between the base and the emitter of the transistor $Q_3$. Similarly, a bias circuit consisting of a diode $D_2$ and a resistor $R_4$ is provided for establishing a bias between the base and emitter of the transistor $Q_4$. Drive transistors $Q_1$ and $Q_2$ are provided for applying the necessary currents to the respective bias circuits. The emitter of the transistors $Q_1$ and $Q_2$ are grounded, and biases are applied to the bases of the transistor $Q_1$ and $Q_2$ by a series circuit of diodes $D_3$ and $D_4$. An input signal, after being amplified by a voltage amplifier circuit 1, drives the transistors $Q_1$ and $Q_2$. In the embodiment shown in FIG. 1, a current source $I_3$ forming a further current path is connected between the cathode of the diode $D_1$ in one of the bias circuits and the anode of the diode $D_2$ in the other bias circuit. The current source, or the current path, may instead by replaced by a high value resistor.

Figure 2:
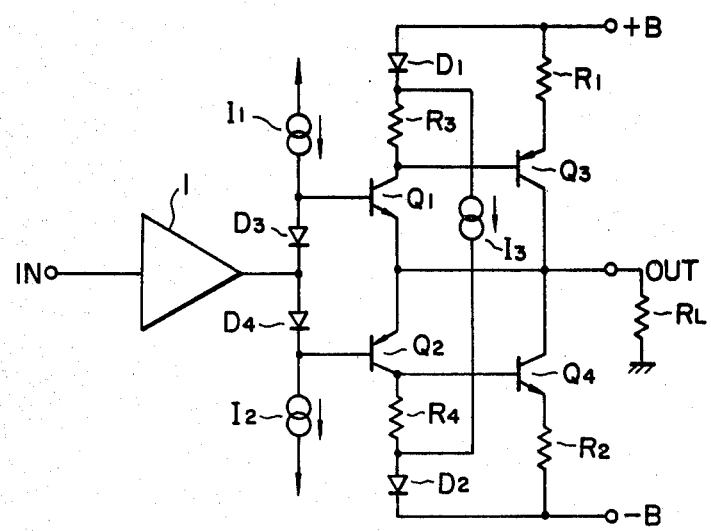

FIG. 2 is a circuit diagram showing a second example of the push-pull amplifier according to this invention. In FIGS. 2 and 1, like parts are designated by like reference characters. In the circuit of FIG. 2, the common emitter connection of drive transistors $Q_1$ and $Q_2$ is connected to the common collector connection of transistors $Q_3$ and $Q_4$ to form an inverted Darlington connection. In this second example also, a current souce $I_3$ serving as a further current path is connected between the cathode of the diode $D_1$ and the anode of the diode $D_2$. As before, the current source $I_3$ may be replaced by a resistor.

The operation of the circuits in FIGS. 1 and 2 will now be described with reference to a partial circuit diagram in FIG. 3 and a waveform diagram in FIG. 4.

Figure 3:
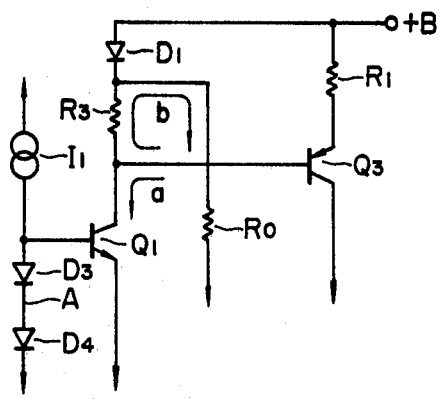
FIG. 3 is a circuit diagram showing a part of the circuit diagrams of the first and second examples shown in FIGS. 1 and 2.

FIG. 3 shows a part of the circuit diagram shown in each of FIGS. 1 and 2. In these figures, like parts are designated by like reference characters. However, it should be noted that a resistor $R_0$ is employed as the current path. When a positive signal is applied to the circuit point A which is the common connecting point of the base bias diode $D_3$ of the drive transistor $Q_1$ and the other diode $D_4$, the transistor $Q_1$ is rendered conductive (on) in its linear range and a current proportional to the input signal is drawn through the diode $D_1$ and the resistor $R_3$ of the bias circuit. Hence, due to this bias current, the output transistor $Q_3$ is forward biased, and a drive current a flows through the conductive drive transistor $Q_1$.

Figure 4A:
FIG. 4 is an output waveform diagram for a description of the operation of the circuits shown in FIGS. 1 and 2.
Figure 4B:
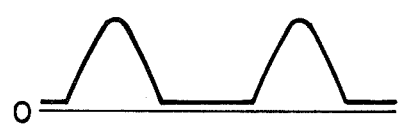

When the voltage at the circuit point A decreases and approaches a negative value, the conduction of transistor $Q_1$ decreases until it becomes non-conductive (off) and therefore its collector current a ceases. Accordingly, drive transistor $Q_1$ will not draw any current through the bias circuit consisting of the diode $D_1$ and the resistor $R_3$. According to this invention, however, since the further current path is provided by the resistor $R_0$, some small forward current will continue to flow through the diode $D_1$, and therefore a forward voltage is still developed across the diode $D_1$. Thus, the base current of the transistor $Q_3$ flows aong a path b, and the collector current (or the output current) has a waveform as shown in FIG. 4B. FIG. 4A shows the waveform of the output current in the case where the resistor $R_0$ is not employed.

Therefore, by suitably setting the value of the current b and accordingly the resistance of the resistor $R_0$, the output transistor $Q_3$ is allowed to operate in its active region at all times.

It goes without saying that the above description is applicable to the other output transistor $Q_4$ and the operation of the remaining half of the bias circuitry will therefore not be described in detail.

Figure 5:
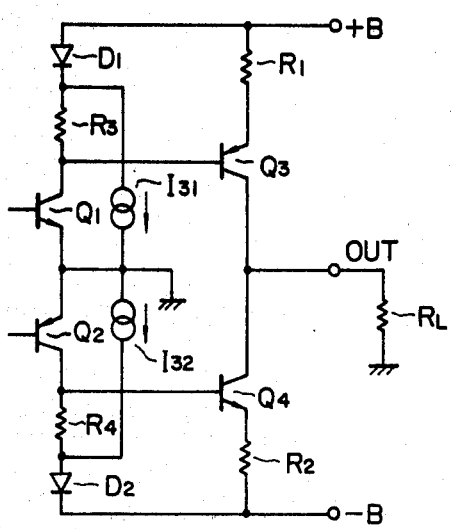
FIGS. 5 through 8 are circuit diagrams showing third through sixth examples of the push-pull amplifier according to this invention.
Figure 6:
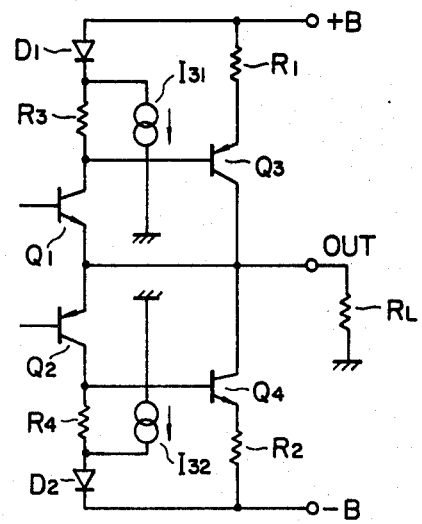

FIGS. 5 and 6 are circuit diagrams showing third and fourth examples of the push-pull amplifier according to this invention. In FIGS. 5 and 6, those components which have been previously described with reference to FIGS. 1 and 2 are therefore designated similarly. In FIG. 5, a current source $I_{31}$ serving as a current path is provided between the cathode of the diode $D_1$ and ground, and a current source $I_{32}$ serving as a current path is provided between the anode of the diode $D_2$ and ground. In FIG. 6, current sources $I_{31}$ and $I_{32}$ are provided for the inverted Darlington circuits in the same way. These current sources may obviously be replaced by resistors.

The circuits in FIGS. 5 and 6 operate similarly as the circuits shown in FIGS. 1 and 2, so that the output transistors operate in their active regions at all times, instead of operating in their cut-off regions during alternate half cycles of operation.

Figure 7:
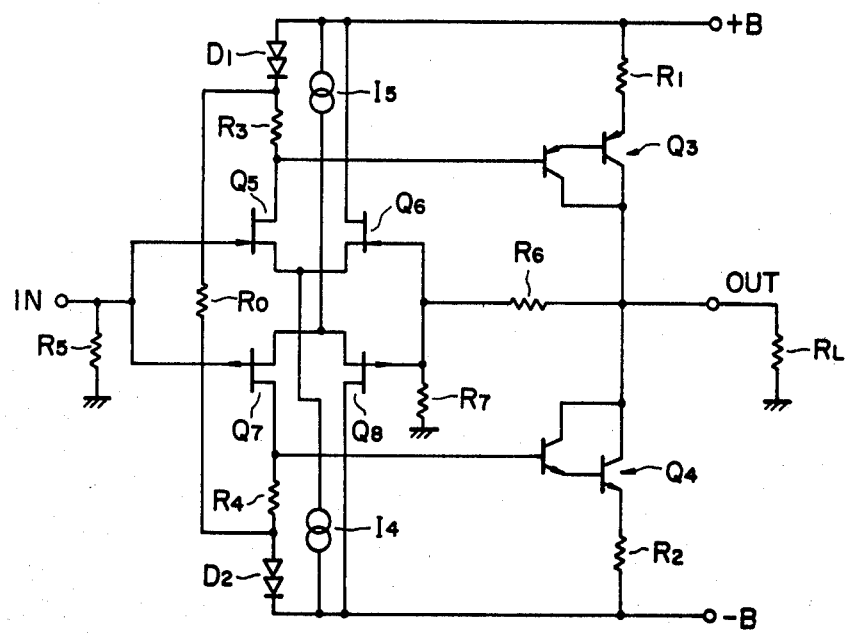

FIG. 7 is a circuit diagram showing a fifth example of the push-pull amplifier according to this invention. In the circuit of FIG. 7, output transistors $Q_3$ and $Q_4$ are Darlington-connected, and the drive stages are connected in a differential amplifier arrangement. A differential amplifier having FETs (field-effect transistors) $Q_5$ and $Q_6$ and a current source $I_4$ is used to drive the output transistor $Q_3$. An output transistor base bias circuit consisting of a diode $D_1$ and a resistor $R_3$ is connected to the drain of the FET $Q_5$. A differential amplifier having FETs $Q_7$ and $Q_8$ and a current source $I_5$ is provided to drive the output transistor $Q_4$. An output transistor base bias circuit consisting of a diode $D_2$ and a resistor $R_4$ is connected to the drain of the FET $Q_7$. In FIG. 7, reference character $R_5$ designates an input resistor; and $R_6$ and $R_7$, feedback resistors. A resistor $R_0$ is connected between the cathode of the diode $D_1$ and the anode of the diode $D_2$, to prevent the output transistors from being cut-off as in the previous embodiments.

Figure 8:
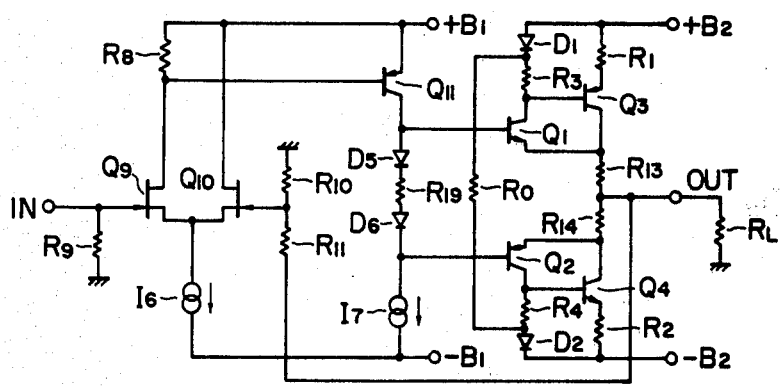

Shown in FIG. 8, is a sixth example of the push-pull amplifier according to this invention. Output transistors $Q_3$ and $Q_4$ and drive transistors $Q_1$ and $Q_2$ form inverted Darlington pairs, respectively. The collector outputs of the output transistors are connected together through resistors $R_{13}$ and $R_{14}$. A differential amplifier consisting of FETs $Q_9$ and $Q_{10}$ and a current source $I_6$ is provided at the voltage amplifying stage. The output of the differential amplifier is obtained through the drain resistor $R_8$ of the transistor $Q_9$ and is applied to the base of a grounded-emitter type PNP transistor $Q_{11}$. With the aid of the collector output of the transistor $Q_{11}$, a signal is applied to a bias circuit consisting of diodes $D_5$ and $D_6$ and a resistor $R_{19}$, to drive the drive transistors $Q_1$ and $Q_2$. In FIG. 8, reference character $I_7$ designates a current supply source for the diodes $D_5$ and $D_6$; $R_9$, an input resistor; and $R_{10}$ and $R_{11}$, feedback resistors.

In this sixth example also, a resistor $R_0$ is connected between the cathode of the diode $D_1$ and the anode of the diode $D_2$, to prevent switching distortion.

As is apparent from the above description, according to this invention, with the simple arrangement of one additional current path the output transistors are prevented from being cut off, and therefore switching distortion is eliminated. In addition, decreases in operating speed attributed to the carrier accumulation effect characteristic of the transistor switching operation can be prevented.

In the above-described examples, the output transistors are bipolar elements; however, the same effects can be obtained by using unipolar elements such as field-effect transistors as the output transistors.

What is claimed is:

1. In a push-pull amplifier of the type having first and second output amplification elements having first and second control electrodes, respectively, each of said amplification elements conducting in response to a current provided to its control electrode, the outputs of said amplification elements being connected together to drive a common load; first and second bias circuits for providing bias currents to said first and second amplification elements, respectively, when activated; and first and second drive elements for alternately activating said first and second bias circuits, the improvements comprising;

means for maintaining each of said first and second bias circuits activated while the other of said first and second bias circuits is being activated by its respective drive element, said means for maintaining comprising a current path provided between said first and second bias circuits for flowing a current to said first or second bias circuit only when said corresponding first or second drive element is switched off; and wherein said first bias circuit comprises a first diode having its anode coupled to a potential source and its cathode coupled through a resistance to said first control electrode, and said second bias circuit comprises a second diode having its cathode coupled to a lower potential source and its anode coupled through a resistance to said second control electrode, said current path being provided between the cathode of said first diode and the anode of said second diode.

2. In a push-pull amplifier of the type having first and second output amplification elements having first and second control electrodes, respectively, each of said amplification elements conducting in response to a current provided to its control electrode, the outputs of said amplification elements being connected together to drive a common load; first and second bias circuits for providing bias currents to said first and second amplification elements, respectively, when activated; and first and second drive elements for alternately activating said first and second bias circuits, the improvements comprising;

means for maintaining each of said first and second bias circuits activated while the other of said first and second bias circuits is being activated by its respective drive elements, said maintaining means comprising current paths provided between each of said bias circuits and a reference potential for flowing a current to said first or second bias circuit only when said corresponding first or second drive element is switched off; and wherein said first bias circuit comprises a first diode having its anode coupled to a potential source and its cathode coupled through a resistance to said first control electrode, and said second bias circuit comprises a second diode having its cathode coupled to a lower potential source and its anode coupled through a resistance to said second control electrode, said current paths comprising a first current path between said first diode cathode and ground and a second current path between said second diode anode and ground.

3. A push-pull amplifier as defined in claim 1, wherein said current path comprises a resistor.

4. A push-pull amplifier as defined in claim 1, wherein said current path comprises a current source.

5. A push-pull amplifier as defined in claim 1, wherein each of said current paths comprises a current source.

6. A push-pull amplifier as defined in claim 1, wherein each said current path comprises a resistor.

* * * * *